United States Patent
Tanaka (10) Patent No.: US 7,949,852 B2
(45) Date of Patent: May 24, 2011

(54) MEMORY SYSTEM, COMPUTER SYSTEM AND MEMORY

(75) Inventor: Shinji Tanaka, Osaka (JP)

(73) Assignee: MegaChips Corporation, Osaka-shi (JP)

(*) Notice: Subject to any disclaimer, the term of this patent is extended or adjusted under 35 U.S.C. 154(b) by 575 days.

(21) Appl. No.: 12/033,311

(22) Filed: Feb. 19, 2008

(65) Prior Publication Data
US 2008/0201546 A1    Aug. 21, 2008

(30) Foreign Application Priority Data
Feb. 20, 2007   (JP) ................... 2007-039387

(51) Int. Cl.
*G06F 11/22*  (2006.01)
*G06F 12/00*  (2006.01)
(52) U.S. Cl. .................... 711/220; 711/203; 714/8
(58) Field of Classification Search ........... 711/200–221
See application file for complete search history.

(56) References Cited

U.S. PATENT DOCUMENTS
5,146,571 A * 9/1992 Logan ................ 714/8
6,906,989 B2   6/2005 Furuhashi FOREIGN PATENT DOCUMENTS
| JP | 10-49447    | 2/1998 |
| JP | 2000-66961  | 3/2000 |
| JP | 2002-279733 | 9/2002 |
| JP | 2004-118967 | 4/2004 |

OTHER PUBLICATIONS
U.S. Appl. No. 12/644,616, filed Dec. 22, 2009, Tanaka.
U.S. Appl. No. 12/646,349, filed Dec. 23, 2009, Tanaka.

* cited by examiner

*Primary Examiner* — Brian R Peugh
*Assistant Examiner* — Nicholas Simonetti
(74) *Attorney, Agent, or Firm* — Oblon, Spivak, McClelland, Maier & Neustadt, L.L.P.

(57) ABSTRACT

The correspondence between logical addresses and physical addresses is determined so that the logical addresses in ascending order may be assigned to the physical addresses in ascending order with the physical addresses of defective blocks in a memory skipped. Then, the physical addresses of the defective blocks in ascending order are sequentially stored into the second blocks in ascending order of the physical addresses of the second blocks, respectively. To obtain a physical address from a logical address, a target block is retrieved out of a plurality of second blocks on the basis of the logical address, and the physical address of the target block is added to the logical address to obtain the physical address. Thus, it is possible to reduce the required capacity of a reserve storage region used for conversion of logical addresses into physical addresses without deteriorating the access speed.

8 Claims, 9 Drawing Sheets

| PHYSICAL ADDRESS | | | PHYSICAL ADDRESS | | 41 |
|---|---|---|---|---|---|
| PBAN | PBA3 | 43 | PBA(N+M-8) | NOU | 43 |
| PBA(N+1) | PBA5 | 43 | PBA(N+M-7) | NOU | 43 |
| PBA(N+2) | PBA7 | 43 | PBA(N+M-6) | NOU | 43 |
| PBA(N+3) | PBA15 | 43 | PBA(N+M-5) | NOU | 43 |
| PBA(N+4) | PBA20 | 43 | PBA(N+M-4) | NOU | 43 |
| PBA(N+5) | PBA21 | 43 | PBA(N+M-3) | NOU | 43 |
| PBA(N+6) | PBA27 | 43 | PBA(N+M-2) | NOU | 43 |
| PBA(N+7) | NOU | 43 | PBA(N+M-1) | NOU | 43 |

FIG. 8

| ADDRESS OF CONTROLLER MEMORY | | | | | 52 |
|---|---|---|---|---|---|
| RAD0 | PBA3 | 56 | RAD(M-8) | NOU | 56 |
| RAD1 | PBA5 | 56 | RAD(M-7) | NOU | 56 |
| RAD2 | PBA7 | 56 | RAD(M-6) | NOU | 56 |
| RAD3 | PBA15 | 56 | RAD(M-5) | NOU | 56 |
| RAD4 | PBA20 | 56 | RAD(M-4) | NOU | 56 |
| RAD5 | PBA21 | 56 | RAD(M-3) | NOU | 56 |
| RAD6 | PBA27 | 56 | RAD(M-2) | NOU | 56 |
| RAD7 | NOU | 56 | RAD(M-1) | NOU | 56 |

MEMORY SYSTEM, COMPUTER SYSTEM AND MEMORY

BACKGROUND OF THE INVENTION

1. Field of the Invention

The present invention relates to a technique in a memory for storing data used directly by a user (user data), which is intended to reduce capacity of a reserve storage region which does not directly store the user data.

2. Description of the Background Art

In memories, generally, logical addresses and physical addresses are directly brought into correspondence with each other since defective blocks are admitted. Therefore, as to memories, it is conventionally well known that reserve storage regions are provided to store information required for conversion between logical addresses and physical addresses.

As a method therefor, a reserve region is provided correspondingly to each data region (block) serving as a unit of access, to store characteristics information indicating whether the block is normal or defective therein. Then, at a predetermined timing (e.g., at power-on), a controller reads the characteristics information from all the reverse regions to make a table on the correspondence between logical addresses and physical addresses. Alternatively, such a table is held in the memory.

(Patent Document 1) Japanese Patent Application Laid Open Gazette No. 10-049447.

Though the characteristics information indicating whether each block is normal or defective is a small piece of information, however, if the information on all the blocks are stored, a rather large reserve region is needed since the number of blocks is very large.

Further, if an accessed block happens to be defective, another block may be retrieved. In this case, however, the access speed is different depending on whether the block is normal or defective, and therefore the access speed that can be assured is reduced.

SUMMARY OF THE INVENTION

The present invention is intended for a memory system.

According to the present invention, the memory system comprises a plurality of first blocks provided for storing user information, to which first physical addresses which are not duplicated are assigned, respectively, a plurality of second blocks provided for storing first physical addresses of defective blocks among the plurality of first blocks, and an operation device for obtaining a first physical address corresponding to a logical address on the basis of the logical address and information stored in the plurality of second blocks.

In the memory system of the present invention, it is not necessary to store the physical addresses of normal first blocks. Alternatively, it is not necessary to store the characteristics (normal or defective) on all the blocks and the transmission-target physical address. Therefore, it is possible to reduce the number of second blocks.

Preferably, second physical addresses which are not duplicated are assigned to the plurality of second blocks, respectively, and the operation device retrieves a target block out of the plurality of second blocks by using the logical address, obtains the number of normal first blocks positioned forward of the first physical address of a defective block which is read out from the target block on the basis of the first physical address of the defective block which is read out from the target block and the second physical address of the target block and obtains the first physical address corresponding to the logical address on the basis of the logical address and the number.

It is thereby possible to easily achieve the above aspect of the present invention.

The present invention is also intended for a computer system.

According to the present invention, the computer system comprises a computer for generating a logical address as needed, a memory having a plurality of first blocks provided for storing user information, to which first physical addresses which are not duplicated are assigned, respectively, a controller memory having a plurality of second blocks provided for storing the first physical addresses of defective blocks among the plurality of first blocks, to which second physical addresses which are not duplicated are assigned, respectively, and an operation device for retrieving a target block out of the plurality of second blocks by using a logical address received from the computer, obtaining the number of normal first blocks positioned forward of the first physical address of a defective block which is read out from the target block on the basis of the first physical address of the defective block which is read out from the target block and the second physical address of the target block and obtaining the first physical address corresponding to the logical address on the basis of the logical address and the number.

In the computer system of the present invention, it is not necessary to store the physical addresses of normal first blocks. Alternatively, it is not necessary to store the characteristics (normal or defective) on all the blocks and the transmission-target physical address. Therefore, it is possible to reduce the number of second blocks.

The present invention is further intended for a memory to which access is made with a physical address by an operation device which obtains the physical address from a logical address.

According to the present invention, the memory comprises a plurality of blocks each consisting of memory elements, to which physical addresses which are not duplicated are assigned, and in the memory of the present invention, the plurality of blocks comprises a plurality of first blocks provided for storing user information and a plurality of second blocks provided for storing physical addresses of defective blocks among the plurality of first blocks, respectively, and the physical addresses of defective blocks in the plurality of second blocks are stored into the plurality of second blocks in the order of physical addresses assigned to the plurality of second blocks in accordance with the order of the physical addresses.

It is thereby possible to reduce the number of second blocks required to obtain the physical address.

The present invention is still further intended for a memory control method of controlling a memory which stores user information therein.

According to the present invention, the memory control method comprises the steps of a) storing addresses of defective blocks among a plurality of first blocks provided in the memory for storing user information therein into a plurality of second blocks, respectively, and b) obtaining an address of one of the first blocks corresponding to a logical address on the basis of the logical address and the information stored in the plurality of second blocks.

By the memory control method of the present invention, it is not necessary to store the physical addresses of normal first blocks. Alternatively, it is not necessary to store the characteristics (normal or defective) on all the blocks and the address of the transmission-target first block. Therefore, it is possible to reduce the number of second blocks.

It is an object of the present invention to reduce the required capacity of a reserve storage region used for conversion of logical addresses into physical addresses without deteriorating the access speed.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, preferred embodiments of the present invention will be discussed in detail with reference to figures.

1. The First Preferred Embodiment

Figure 1:
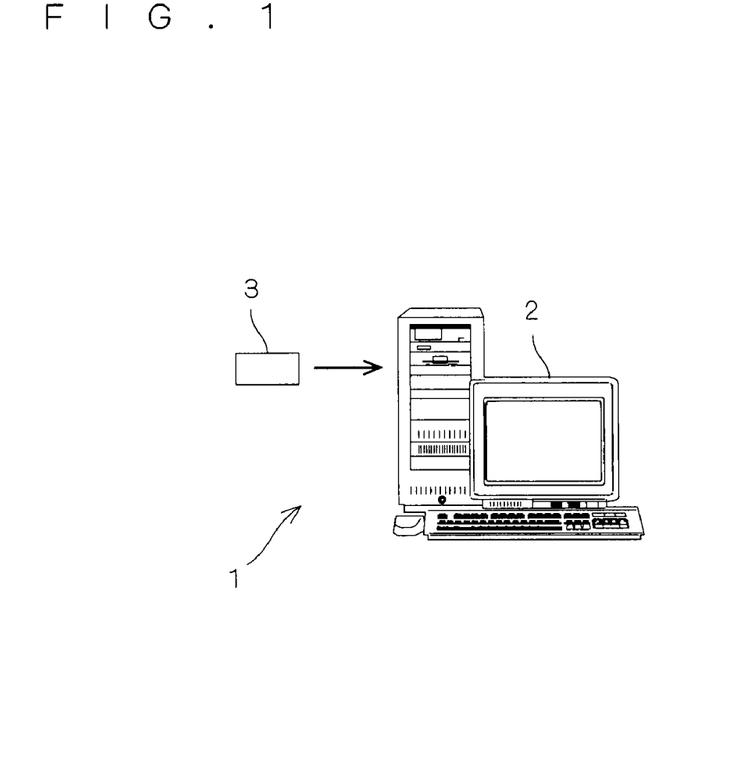
FIG. 1 is a view showing a computer system in accordance with the present invention.

FIG. 1 is a view showing a computer system 1 in accordance with the present invention. The computer system 1 is constituted of a computer 2 having a function as a general-type personal computer and a memory card 3 which is inserted into a card slot of the computer 2.

Figure 2:
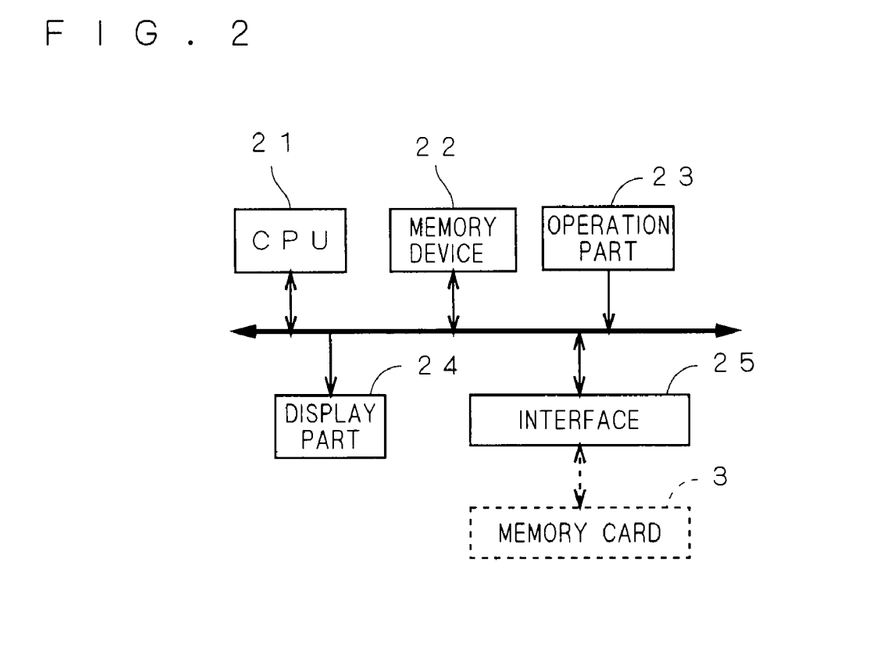
FIG. 2 is a block diagram showing a constitution of a computer.

FIG. 2 is a block diagram showing a constitution of the computer 2. The computer 2 comprises a CPU 21 for performing computation of various data, generation of control signals and the like, a memory device 22 for storing various data, an operation part 23 used for inputting user's instructions to the computer 2, a display part 24 for presenting various data to the user and an interface 25. As the operation part 23 used are, e.g., a mouse, a keyboard and the like. As the display part 24 used are, e.g., a liquid crystal display, a CRT and the like.

The computer 2 operates in accordance with programs such as application software or the like stored in the memory device 22, and sends an access request to the memory card 3 as needed.

The access request discussed below refers to a write request for user data and a read request for user data stored in the memory card 3 (memory 4). Therefore, if the access request is a write request, a logical address indicating a writing position of user data to be written is generated, and if the access request is a read request, a logical address indicating the position at which user data to be read out is stored is generated. Specifically, the access request generated in the computer 2 includes a logical address and the computer 2 sends the access request to the memory card 3 through the interface 25.

Figure 3:
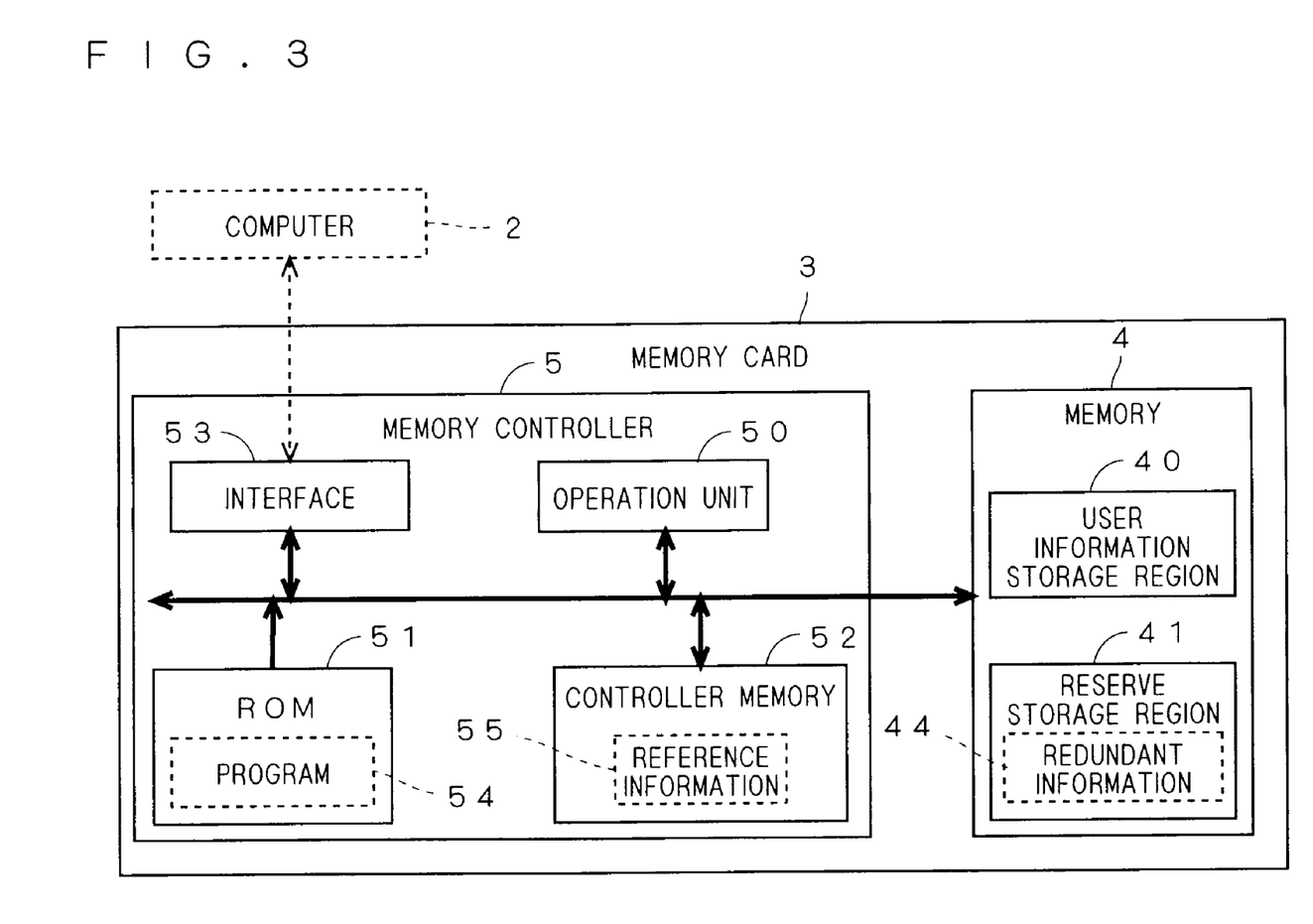
FIG. 3 is a block diagram showing a constitution of a memory card.

FIG. 3 is a block diagram showing a constitution of the memory card 3. The memory card 3 comprises a memory 4 and a memory controller 5 for controlling the memory 4 and is detachable from the computer 2.

Figure 4:
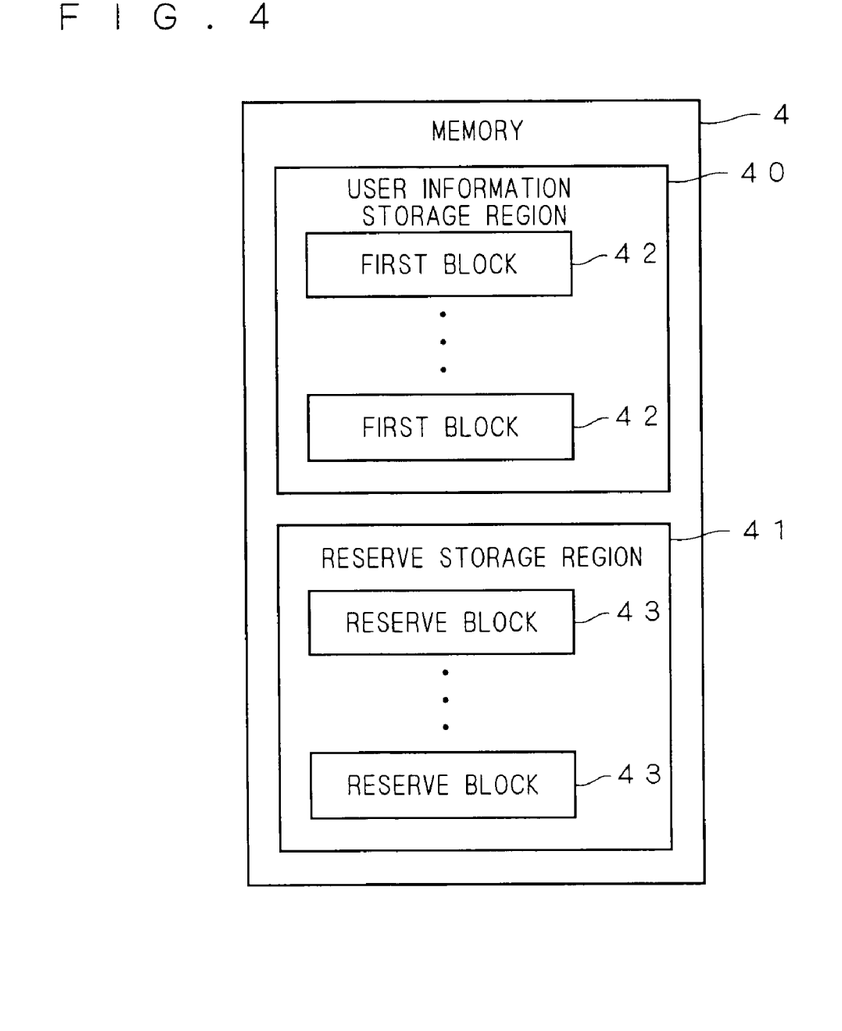
FIG. 4 is a schematic diagram showing an internal structure of a memory.

FIG. 4 is a schematic diagram showing an internal structure of the memory 4. As shown in FIG. 4, the memory 4 comprises a user information storage region 40 consisting of a plurality of first blocks 42 and a reserve storage region 41 consisting of a plurality of reserve blocks 43.

Figure 5:
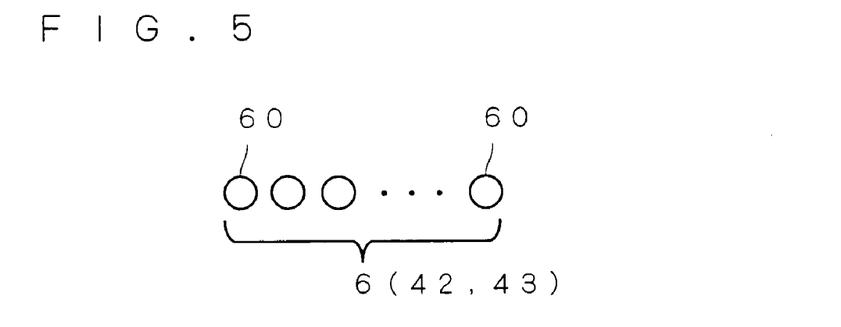
FIG. 5 is a view showing a structure of a block (first block or reserve block) in the memory.

FIG. 5 is a view showing a structure of a block 6 (first block 42 or reserve block 43) in the memory 4. Each of a plurality of blocks 6 included in the memory 4, as shown in FIG. 5, consists of a plurality of memory elements 60 (a group of memory elements), which is a set of memory elements each of which is accessed with one of physical addresses (the first physical addresses) which are not duplicated.

The memory element 60 of the memory 4 is a nonvolatile memory element in this preferred embodiment, but the memory element is not limited to this type.

Further, this preferred embodiment shows a case in FIG. 5 where the first block 42 and the reserve block 43 each comprise the same number of memory elements 60. But the number of memory elements 60 included in the first block 42 has only to be at least the number of memory elements 60 required to store user data specified by one physical address. In other words, the number of memory elements 60 depends on the capacity of user data to be read (or written) through one access. The number of memory elements 60 included in the reserve block 43 has only to be at least the number of memory elements 60 required to store the physical address which individually designates the first block 42. In other words, the length (capacity) of physical address depends on the number of first blocks 42 included in the memory 4. Therefore, the number of memory elements 60 included in the first block 42 may be different from the number of memory elements 60 included in the reserve block 43.

Figure 6:
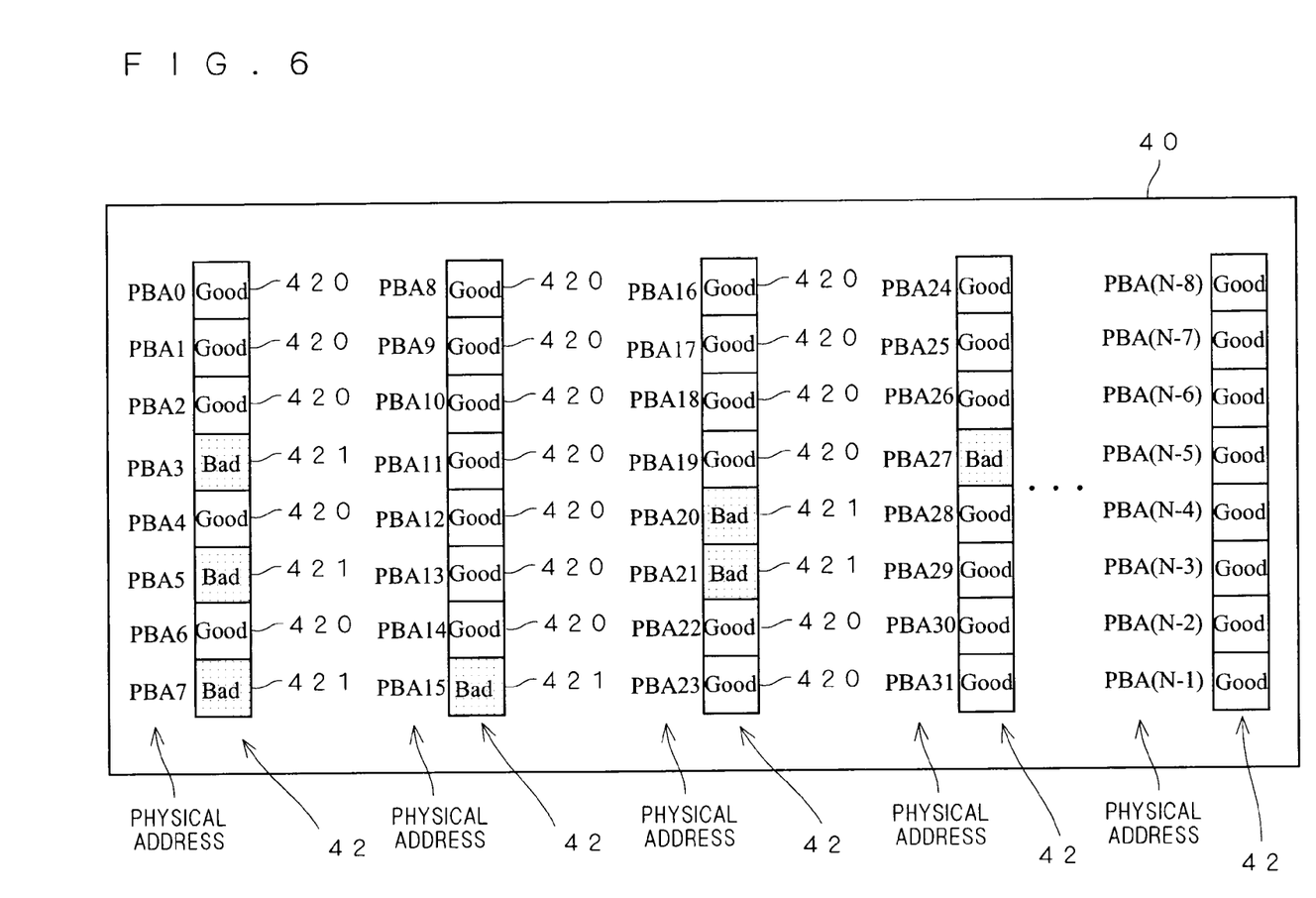
FIG. 6 is an illustration of a user information storage region.

FIG. 6 is an illustration of the user information storage region 40. In this description, for example, the physical addresses of a specific physical address space (A) are generally referred to as "physical addresses A" and the k-th physical address A among them is referred to as "physical address Ak" (k is an integer not smaller than 0).

The user information storage region 40 is a storage region consisting of a plurality of (N) first blocks 42 as discussed above, and stores user data therein (N is a natural number). To each of the first blocks 42, one of physical addresses PBA (PBA0 to PBA(N−1)) which are not duplicated is assigned. The physical address PBA in the memory 4 corresponds to the first physical address of the present invention.

The first blocks 42 formed in the memory 4 as a product, generally, include blocks to which normal access can be made (normal blocks 420) and other blocks to which normal access can not be made (defective blocks 421). Since no access can be made to the defective blocks 421 (which can not be used), no user data is stored in the defective blocks 421 and no logical address is assigned thereto.

For convenience of illustration, FIG. 6 shows a condition where "Good" is stored in the normal blocks 420 and "Bad" is stored in the defective blocks 421 as information. In this preferred embodiment, however, one unit for storing user data is defined as the first block 42, and the first block 42 does not store information indicating the state of block therein. This, however, does not prohibit any storage region other than the first blocks 42 (the user information storage region 40) from storing information indicating the state of block or the like.

Figure 7:
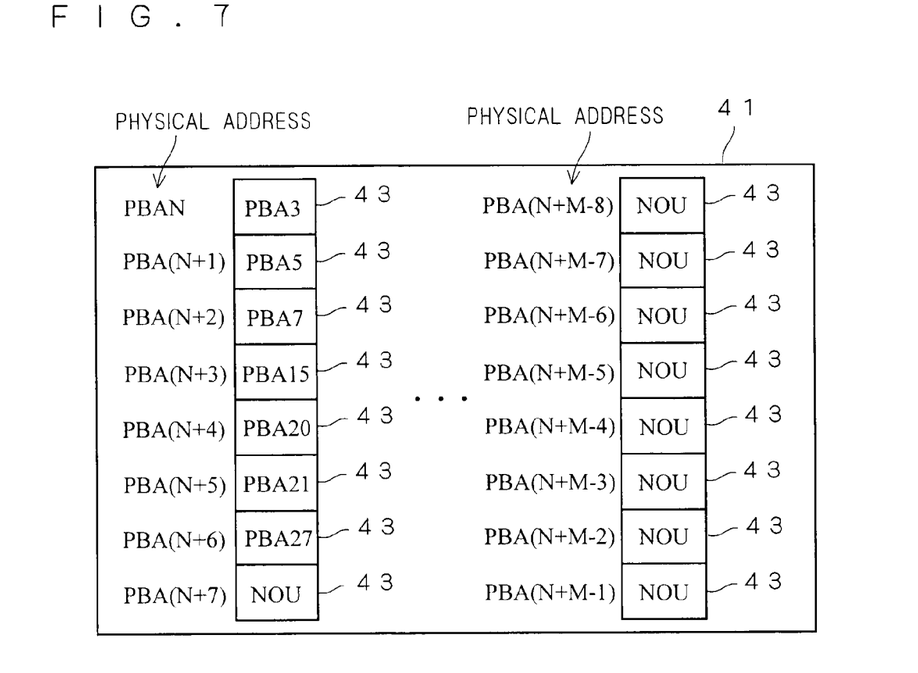
FIG. 7 is an illustration of a reserve storage region corresponding to the user information storage region shown in FIG. 6.

FIG. 7 is an illustration of the reserve storage region 41 corresponding to the user information storage region 40 shown in FIG. 6. The reserve storage region 41 is a storage region consisting of a plurality of (M) reserve blocks 43, as discussed above, and stores redundant information 44 (see FIG. 3) therein. In other words, the redundant information 44 is a set of information which are stored in the reserve blocks 43. In this preferred embodiment, $M=2^n$ (n is a natural number).

The redundant information 44 of this preferred embodiment refers to information required for conversion of the logical address into the physical address by the memory controller 5 described below and does not refer to all the information other than the user information among the information stored in the memory 4. In this preferred embodiment, the reserve storage region 41 is defined as a region for storing the redundant information 44, and this does not mean that only the reserve storage region 41 is provided as a region for storing information other than the user information in the memory 4. Therefore, the memory 4 may be provided with other reserve storage regions for storing information other than the user information or the redundant information 44 (e.g., information for ECC or the like).

To each of the reserve blocks 43, one of physical addresses PBA (PBAN to PBA(N+M−1)) in the memory 4 is assigned. In this preferred embodiment, the physical address of the last first block 42 in the user information storage region 40 is a physical address PBA(N−1) and the physical address of the first reserve block 43 in the reserve storage region 41 is a physical address PBAN. In other words, the user information storage region 40 and the reserve storage region 41 are assigned to be contiguous but not limited to this assignment.

Some of the reserve blocks 43 each store invalid information ("NOU" in FIG. 7) indicating that the reserve block 43 is not used and others store the physical addresses of the defective blocks 421 (physical addresses PBA3, PBA5, PBA7, PBA15, PBA20, PBA21, PBA27 in the exemplary case of FIG. 7). The information stored in the reserve block 43 has only to be information to acquire the physical address PBA of a defective block 421.

The number M of reserve blocks 43 depends on the number of defective blocks 421 that the memory 4 as a product can admit. If the memory 4 admits 256 defective blocks 421 at the most, for example, the memory 4 is designed to include at least 256 reserve blocks 43. Therefore, the reserve blocks 43 as many as the actually-existing defective blocks 421 store the physical addresses PBA of the defective blocks 421, respectively, and other reserve blocks 43 each store the invalid information NOU.

In this preferred embodiment, as the value of the invalid information NOU, a sufficiently large number is adopted as compared with the number N of first blocks 42. The information stored as the invalid information NOU, however, has only to be information distinguishable from the physical addresses PBA of the defective blocks 421.

The defective block 421 is detected in an inspection process or the like for the memory 4, and the physical address PBA thereof is stored in any one of the reserve blocks 43. The inspection process will not be discussed in detail but the physical addresses PBA of the detected defective blocks 421 are sequentially stored in the order that the memory controller 5 described below accesses the reserve storage regions 41 for readout (in ascending order of the physical addresses PBA of the reserve blocks 43 in this preferred embodiment) (in ascending order of the physical addresses PBA of the defective blocks 421). Further, when detection for all the defective blocks 421 is completed, the invalid information NOU is stored in the remaining reserve blocks 43. Thus, any information is stored in all the reserve blocks 43, to make redundant information 44 in the reserve storage region 41.

If no defective block 421 exists in the memory 4, the redundant information 44 does not include any physical address PBA of defective block 421. Further, if there are defective blocks 421 as many as the reserve blocks 43 included in the memory 4, the redundant information 44 includes no invalid information NOU.

Referring back to FIG. 3, the memory controller 5 comprises an operation unit 50, a ROM 51 for storing programs 54, a controller memory 52 formed as an SRAM and an interface 53 for making a connection with the computer 2. The memory controller 5 makes access to the memory 4 in response to the access request received from the computer 2.

The operation unit 50 of the memory controller 5 operates in accordance with the program 54 stored in the ROM 51 and obtains the physical address PBA of the first block 42 which is required to be accessed from the logical address LBA included in the access request received from the computer 2 by performing computation on the basis of the reference information 55 stored in the controller memory 52.

The operation unit 50 performs computation of Eq. 1 by using the logical address LBA and an offset OFF to obtain the physical address PBA of the first block 42 which is required to be accessed, though its operation will be discussed in detail later.

$$PBA = LBA + OFF \qquad \text{(Eq. 1)}$$

The controller memory 52 consists of memory elements (not shown) which can be accessed with a higher speed than the memory elements 60 constituting the block 6 of the memory 4 and stores the reference information 55 which is the result of transmission of the redundant information 44 stored in the reserve storage region 41. The reference information 55 stored in the controller memory 52 is referred to by the operation unit 50. In this preferred embodiment, as the memory elements constituting the controller memory 52, nonvolatile memory elements are used in order to achieve high-speed access.

Figure 8:
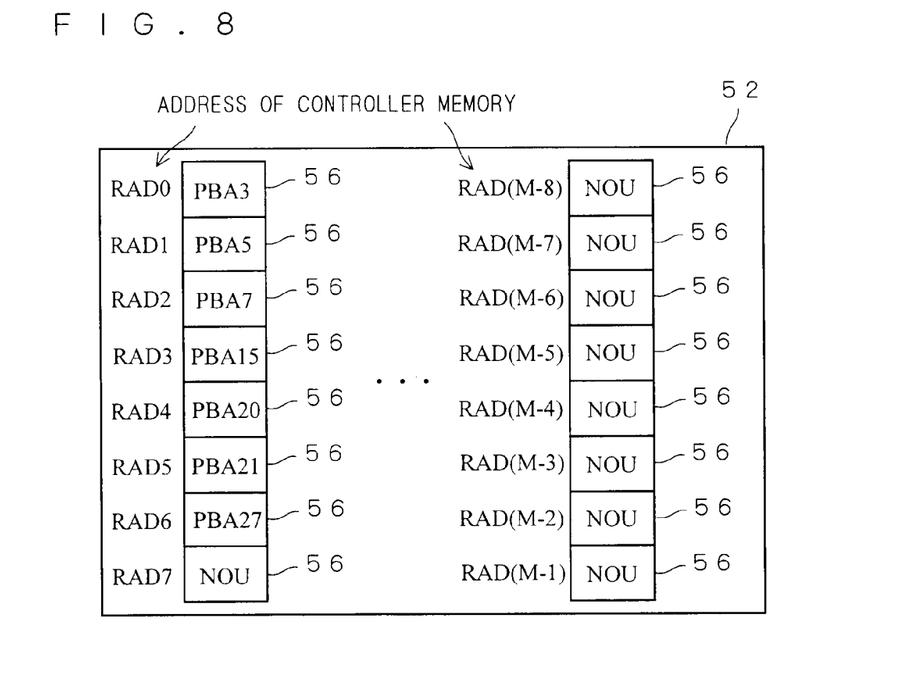
FIG. 8 is an illustration of a state where redundant information shown in FIG. 7 is stored in a controller memory as reference information.

FIG. 8 is an illustration of a state where the redundant information 44 shown in FIG. 7 is stored in the controller memory 52 as the reference information 55.

The controller memory 52 comprises a plurality of (M) second blocks 56 capable of storing information stored in the reserve blocks 43, respectively. To the second blocks 56, physical addresses RAD (the second physical addresses) which are not duplicated are assigned.

In transmission of the redundant information 44 to the controller memory 52, the operation unit 50 of the memory controller 5 makes access to the reserve blocks 43 sequentially in the order of the physical addresses PBA in the reserve storage regions 41 and stores information (the physical addresses PBA of the defective blocks 421 or the invalid information NOU) stored in the reserve blocks 43 into the second blocks 56 in the order of the physical addresses RAD of the second blocks 56. In other words, the operation unit 50 also has a function as a transmission part of the present invention.

Since the reference information 55 is a set of information stored in the second blocks 56, the reference information 55 of this preferred embodiment is made in the controller memory 52 as the same information as the redundant information 44.

With the reference information 55 which is thus made, the difference obtained by subtracting the physical address RAD of the second block 56 from the physical address PBA of the defective block 421 which is stored in the second block 56 indicates the number of normal blocks 420 which exist forward of the physical address PBA of the defective block 421 which is stored in the second block 56.

Referring to the cases of FIGS. 6 and 8, for example, the value read out from the second block 56 which is designated by the physical address RAD3 is "15 (PBA15)" and by subtracting "3 (RAD3)" from this value, a value of "12" is obtained. As confirmed from FIG. 6, there exist twelve normal blocks 420 forward of the defective block 421 (the first block 42) designated by the physical address PBA15. In other words, there exist twelve normal blocks 420 to which logical addresses LBA can be assigned, forward of the physical address PBA15. Therefore, the first to twelfth logical addresses LBA can be assigned to the physical addresses PBA of the first blocks 42 existing forward of the physical address PBA15.

The interface 53 has a shape to engage the interface 25 of the computer 2 and makes an electrical connection between the computer 2 and the memory card 3. As the interfaces 25 and 53, for example, PCMCIA and ATA in conformity with the standard may be adopted but the interfaces of the present invention are not limited to these. Further, the interfaces 25 and 53 are not necessarily connected directly with each other, but these interfaces may be connected with each other through a cable or if the memory card 3 is a non-contact type, these may be connected with each other via wireless. In other words, only if the computer 2 and the memory card 3 are so connected as to allow data communication, any connection structure may be adopted.

The constitution and function of the computer system 1 have been discussed above. Next, an operation of the computer system 1 will be discussed.

Figure 9:
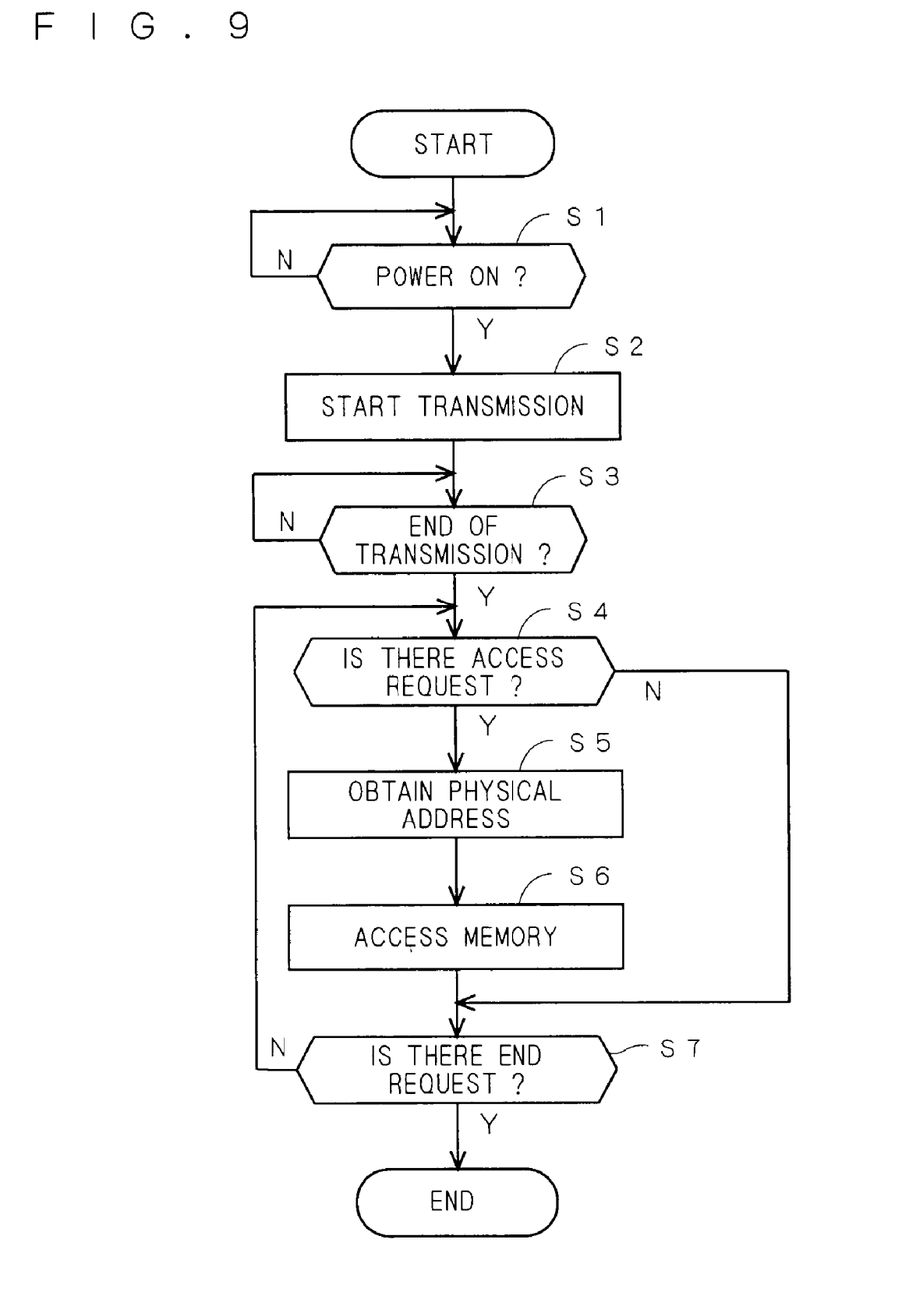
FIG. 9 is a flowchart mainly showing an operation of a memory card (memory controller)

FIG. 9 is a flowchart mainly showing an operation of the memory card 3 (memory controller 5).

First, when the memory card 3 is powered on, the memory controller 5 judges "Yes" in Step S1. The power-on of the memory card 3 refers to the start of power supply to the memory card 3 and includes the timing where the memory card 3 is attached to the computer 2 which has been powered on.

On judging "Yes" in Step S1, the memory controller 5 makes access to the reserve storage region 41 of the memory 4 to read the redundant information 44 out therefrom and starts transmission of the redundant information 44 which is read out to the controller memory 52 (Step S2). The physical addresses PBA in the reserve storage region 41 (for the reserve blocks 43) of the memory 4 are fixed with respect to a product, and prior to execution of Step S2, the memory controller 5 has acquired the physical addresses in advance.

The memory controller 5 of this preferred embodiment sequentially makes access to the first reserve block 43 to the last reserve block 43 which constitute the reserve storage region 41 (that is, makes access M times) and sequentially transmits the information stored in the reserve blocks 43 which are accessed to the second block 56. Thus, as shown in FIG. 8, the same information as stored in the reserve storage region 41 shown in FIG. 7 are stored in the controller memory 52.

Only if the reference information 55 shown in FIG. 8 is eventually made in the controller memory 52, any order of storing operations in the reserve storage region 41 and any order of reading data by the memory controller 5 may be adopted.

When the transmission of the redundant information 44 (generation and storage of the reference information 55) is completed, the memory controller 5 judges "Yes" in Step S3 and gets on standby, monitoring if there comes an access request or an end request from the computer 2 (Steps S4 and S7).

When user data is needed to be written into or read out from the memory 4 in the computer 2, the computer 2 generates an access request to send it to the memory card 3. The access request sent from the computer 2 includes a logical address LBA as discussed above.

Receiving the access request (logical address LBA) in the standby state, the memory controller 5 judges "Yes" in Step S4 and the operation unit 50 obtains the physical address PBA by computation.

The operation of Step S5 will be discussed below. In the following discussion, the physical address RAD of the second block 56 to which the operation unit 50 gives attention is referred to as "index I" and the value read out from the second block 56 (to which attention is given) specified by the index I is referred to as "RDV(I)". One of the second blocks 56, which is used to obtain the offset OFF, is referred to as "target block".

For computation of Eq. 1, the operation unit 50 needs to determine the offset OFF. The operation unit 50 obtains the offset OFF by computation through determining one target block with respect to one logical address LBA. In other words, the operation unit 50 retrieves the target block among a plurality of second blocks 56 included in the controller memory 52 on the basis of the logical address LBA, to obtain the offset OFF.

First, the operation unit 50 sets the index I to RAD0 (=0) and gives attention to the leading second block 56 to perform computation of Eq. 2.

$$RDV(I)-I=NUM \qquad (Eq.\ 2)$$

Specifically, the value of NUM is obtained by subtracting the physical address RAD of the second block 56 specified by the index I from the physical address PBA of the defective block 421 which is stored in the specified second block 56. This NUM indicates the number of normal blocks 420 which exist forward of the defective block 421 specified by the physical address PBA stored in the specified second block 56.

Next, the operation unit 50 judges whether Eq. 3 is true or false.

$$NUM > LBA \qquad (Eq.\ 3)$$

If Eq. 3 is "True", the second block 56 specified by the index I (physical address RAD0) is determined as the target block.

On the other hand, in a case where Eq. 3 is "False", there are various methods of retrieving the target block among a plurality of second blocks 56. In this preferred embodiment, an exemplary case of using a kind of binary search will be discussed.

Figure 10:
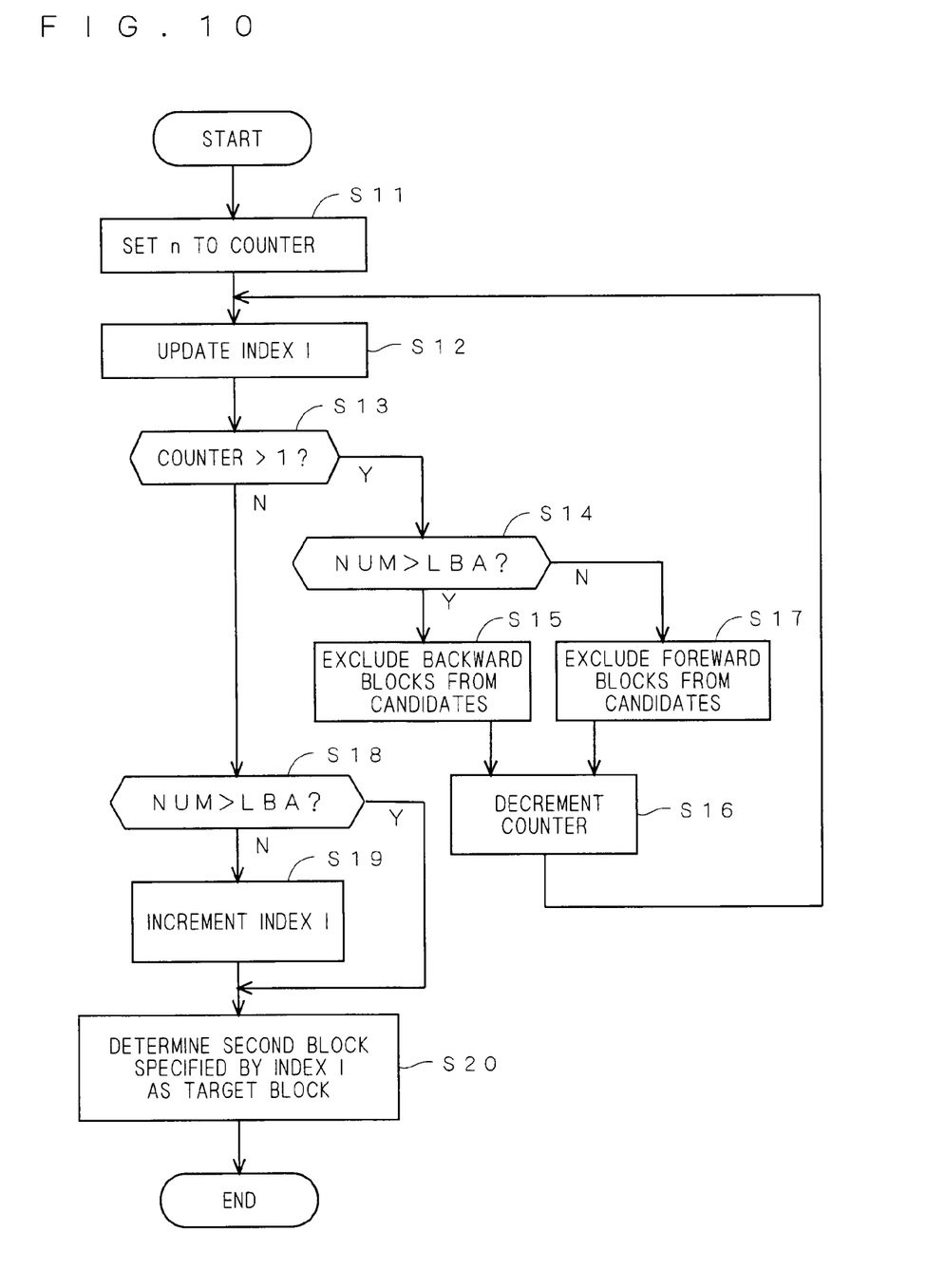
FIG. 10 is a flowchart showing an operation for determining a target block.

FIG. 10 is a flowchart showing an operation for determining the target block.

First, "n" is set to a counter (Step S11) and the index I is updated so that one of the remaining second blocks 56 that are candidates for the target block, which is at a center position, can be specified (Step S12).

Herein, if there remain an even number of second blocks 56, one of the two second blocks 56 which are at a center position, which has a larger physical address RAD, is specified as a central second block 56. In a case where there remain four candidate second blocks 56 which are designated by the physical addresses RAD0 to RAD3, for example, the central second block 56 is the second block 56 designated by the physical address RAD2.

When the index I is updated, the value of the counter is checked (Step S13).

If the value of the counter is larger than "1" ("Yes" in Step S13), the operation unit 50 performs computation of Eq. 2 and judges whether Eq. 3 is true or false (Step S14).

If Eq. 3 is judged "True" ("Yes" in Step S14), the second block 56 indicated by the index I and the second blocks 56 positioned backward of it are excluded from the candidates for the target block (Step S15) and the counter is decremented (Step S16). Then, the operation goes back to Step S12.

On the other hand, if Eq. 3 is judged "False" ("No" in Step S14), the second block 56 indicated by the index I and the second blocks 56 positioned forward of it are excluded from the candidates for the target block (Step S17) and the counter is decremented (Step S16). Then, the operation goes back to Step S12.

Thus, if there are M ($2^n$) second blocks 56, by repeating the operation of excluding unnecessary second blocks 56 from the candidates for the target block (n−1) times, the candidate for the target block is narrowed to one.

Repeating Steps S12 to S17, when the value of the counter becomes "1", judgment in Step S13 is "No". Then, the operation unit 50 performs computation of Eq. 2 and judges whether Eq. 3 is true or false (Step S18).

This judgment in Step S18 means that it is judged whether the conversion-target first block 42 is a defective block 421 or not.

If judgment in Step S18 is "No", the index I is incremented in order to shift the conversion-target first block 42 backward by one (Step S19) and the second block 56 indicated by the index I is determined as the target block.

Though detailed discussion will not be made, if the first blocks 42 positioned in series are defective blocks 421, in the operations of Steps S12 to S17, there is no case where any one defective block 421 other than the last defective block 421 is determined as the conversion target. Therefore, since the first block 42 next to the last defective block 421 is always a normal block 420, the first block 42 which is specified by increment in Step S19 can not be a defective block 421 again.

On the other hand, if judgment in Step S18 is "Yes", since the conversion target is a normal block 420, the operation goes back to Step S20 without incrementing the index I.

When the target block is determined in Step S20, the operation unit 50 performs computation of Eq. 1 with the index I (the physical address RAD specifying the target block) used as the offset OFF to obtain the physical address PBA.

Figure 11:
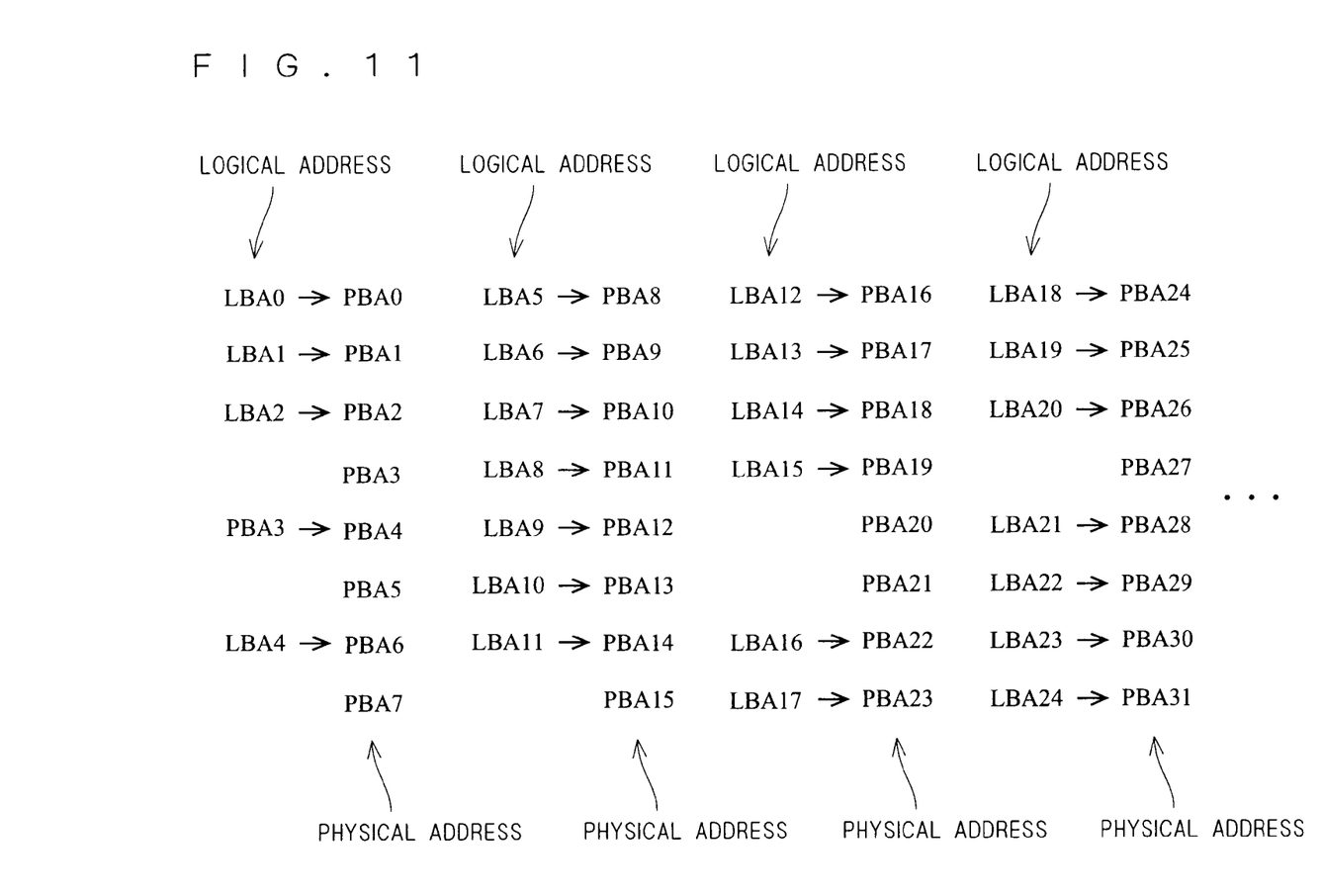
FIG. 11 is an illustration of the correspondence between logical addresses LBA and physical addresses PBA.

FIG. 11 is an illustration of the correspondence between the logical addresses LBA and the physical addresses PBA. FIG. 11 shows an exemplary case where there are defective blocks 421 as shown in FIG. 6. As discussed above, since the physical address PBA is obtained from the logical address LBA, the conversion relationship shown in FIG. 11 is made in the computer system 1 of this preferred embodiment.

Herein, discussion will be made on an operation for obtaining the physical addresses PBA with respect to the logical address LBA5 and the logical address LBA16 in the case where there exist defective blocks 421 as shown in FIG. 6 where N=32, M=$2^n$=$2^4$=16, as an example, First, when the logical address LBA5 is given, since Eq. 3 is judged "False", the binary search shown in FIG. 10 is executed and n (=4) is set to the counter. Then, since $2^{4-1}$+1=9, the index I is set to "RAD($2^{4-1}$)" specifying the 9-th second block 56 as the central second block 56.

In the physical address RAD($2^{4-1}$), i.e., the physical address 8, NOU is stored. Herein, since NOU is a sufficiently large number, NUM obtained by Eq. 2 is a sufficiently large number and Eq. 3 is judged "True" in Step S14. Therefore, the second block 56 designated by the physical address RAD8 and the second blocks 56 positioned backward of it are excluded from the candidates for the target block and the value of the counter is decremented to "3".

Next, the index I is set to the center of the remaining candidates, i.e., "RAD4". At this time, since the counter indicates "3", judgment in Step S13 is "Yes".

Then, Step S14 is executed again and it is found from Eq. 2 that NUM=16. Now, since the given logical address is "LBA5", Eq. 3 is judged "True" in Step S14 again. Therefore, Step S15 is executed to exclude the physical addresses RAD4 to RAD7 from the candidates, and the value of the counter is decremented to "2".

Next, the index I is set to the center of the remaining candidates, i.e., "RAD2". At this time, since the counter indicates "2", judgment in Step S13 is "Yes".

Then, Step S14 is executed again and it is found from Eq. 2 that NUM=5. Now, Eq. 3 is judged "False" in Step S14. Therefore, Step S17 is executed to exclude the physical addresses RAD0 to RAD2 from the candidates, and the value of the counter is decremented to "1".

Next, the index I is set to "RAD3". At this time, the candidate is narrowed to one second block 56 designated by the address RAD3, and since the counter indicates "1", judgment in Step S13 is "No".

When Step S18 is executed, it is found from Eq. 2 that NUM=12 and Eq. 3 is judged "True". Therefore, Step S19 is not executed, and in Step S20, the physical address RAD3 is determined as the physical address of the target block and the offset OFF becomes "3".

Therefore, 5+3=8 from Eq. 1, and the logical address LBA5 is converted into the physical address PBA8. In other words, it is found that the first block 42 accessed with the logical address LBA5 is the first block 42 designated by the physical address PBA8.

Similarly, the case where the logical address LBA16 is given will be discussed. Also in this case, since Eq. 3 is judged "False", the binary search shown in FIG. 10 is executed and n (=4) is set to the counter. Then, since $2^{4-1}$+1=9, the index I is set to "RAD($2^{4-1}$)" specifying the 9-th second block 56 as the central second block 56.

In the physical address RAD($2^{4-1}$), i.e., the physical address 8, NOU is stored. Herein, since NOU is a sufficiently large number, NUM obtained by Eq. 2 is a sufficiently large number and Eq. 3 is judged "True" in Step S14. Therefore, the second block 56 designated by the physical address RAD8 and the second blocks 56 positioned backward of it are excluded from the candidates for the target block and the value of the counter is decremented to "3".

Next, the index I is set to the center of the remaining candidates, i.e., "RAD4". At this time, since the counter indicates "3", judgment in Step S13 is "Yes".

Then, Step S14 is executed again and it is found from Eq. 2 that NUM=16. Now, since the given logical address is "LBA16", Eq. 3 is judged "False" in Step S14. Therefore, Step S17 is executed to exclude the physical addresses RAD0 to RAD4 from the candidates, and the value of the counter is decremented to "2".

Next, the index I is set to the center of the remaining candidates, i.e., "RAD6". At this time, since the counter indicates "2", judgment in Step S13 is "Yes".

Then, Step S14 is executed again and it is found from Eq. 2 that NUM=21. Now, Eq. 3 is judged "True" in Step S14. Therefore, Step S15 is executed to exclude the physical addresses RAD6 and RAD7 from the candidates, and the value of the counter is decremented to "1".

Next, the index I is set to "RAD5". At this time, the candidate is narrowed to one second block 56 designated by the address RAD5, and since the counter indicates "1", judgment in Step S13 is "No".

When Step S18 is executed, it is found from Eq. 2 that NUM=16 and Eq. 3 is judged "False". Therefore, Step S19 is executed and the index I is incremented to become "physical address RAD6". Then, in Step S20, the physical address RAD6 is determined as the physical address of the target block and the offset OFF becomes "6".

Therefore, 16+6=22 from Eq. 1, and the logical address LBA16 is converted into the physical address PBA22. In other words, it is found that the first block 42 accessed with the logical address LBA16 is the first block 42 designated by the physical address PBA22.

This binary search has an advantage that the search can be made at a high speed even if the number of second blocks 56 is relatively large. Specifically, the search among $2^n$ second blocks 56 can be made by performing computation about n times.

Referring back to FIG. 9, after the operation unit 50 obtains the physical address PBA from the received logical address LBA, the memory controller 5 makes access to the memory 4 on the basis of the obtained physical address PBA (Step S6).

At this time, if the access request is made for a write operation, the memory controller 5 controls the memory 4 to write user data into the first block 42 designated by the obtained physical address PBA. On the other hand, if the access request is made for a read operation, the memory controller 5 controls the memory 4 to read user data stored in the first block 42 designated by the obtained physical address PBA. The read-out user data is transmitted to the computer 2 through the interface 53.

Then, when Step S6 is finished, the memory controller 5 gets on standby again. Receiving the end request in the standby state, the memory controller 5 judges "Yes" in Step S7 and finish the operation.

Thus, in this preferred embodiment, the controller memory 52 comprises a plurality of second blocks 56 provided to store the physical addresses PBA of the defective blocks 421 among a plurality of first blocks 42, respectively, and the operation unit 50 obtains the physical address PBA corresponding to the logical address LBA on the basis of the logical address LBA and the information (physical addresses PBA of the defective blocks 421) stored in the second blocks 56.

This eliminates the necessity of storing the physical addresses PBA of normal first blocks 42 in the memory 4 or the controller memory 52. Alternatively, this eliminates the necessity of storing the characteristics (normal or defective) on all the first blocks 42 and the transmission-target physical address PBA. In other words, it is possible to reduce the capacity (volume) of information required to convert the logical address LBA into the physical address PBA.

The operation unit 50, especially, retrieves a target block among a plurality of second blocks 56 by using the logical address LBA, and obtains the number of normal first blocks 42 positioned forward of the first physical address of the defective block 421 which is read out from the target block on the basis of the first physical address of the defective block 421 which is read out from the target block and the second physical address of the target block and obtains the physical address PBA corresponding to the logical address LBA on the basis of the logical address LBA and the number of normal first blocks 42.

This makes it possible to easily obtain the physical address PBA corresponding to the logical address LBA.

In other words, the logical addresses LBA in ascending order are assigned to the physical addresses PBA in ascending order with the defective blocks 421 skipped (as shown in the correspondence of FIG. 11) and the physical addresses PBA of the first blocks 42 detected as the defective blocks 421 are stored into a series of second blocks 56 in the order of the physical addresses PBA, respectively, and this makes it possible to reduce the capacity (volume) of information to be stored.

2. The Second Preferred Embodiment

Though the binary search is shown as a method of retrieving the target block in the first preferred embodiment, the method thereof is not limited to this. In the second preferred embodiment, discussion will be made on a sequential search from the top backward.

Figure 12:
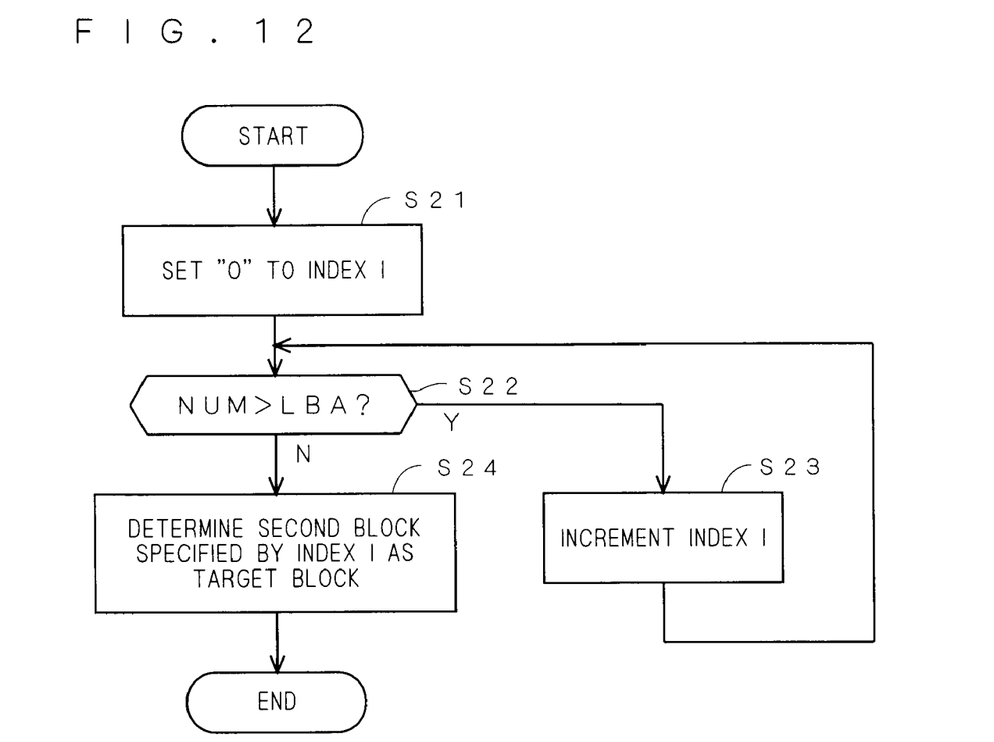
FIG. 12 is a flowchart showing an operation for retrieving the target block in accordance with a second preferred embodiment.

FIG. 12 is a flowchart showing an operation for retrieving the target block in accordance with the second preferred embodiment.

First, the operation unit 50 sets the index I to "RAD0 (=0)" (Step S21), performs computation of Eq. 2 to obtain NUM and thereby judges Eq. 3 (Step S22).

If judgment in Step S22 is "No", the index I is incremented, and the operation goes back to Step S21.

On the other hand, if judgment in Step S22 is "Yes", the second block specified by the index I is determined as the target block and computation of Eq. 1 is performed with the index I used as the offset OFF to obtain the physical address PBA.

Thus, also by the method of the second preferred embodiment, an appropriate target block can be determined and therefore an appropriate physical address PBA can be obtained. This method has an advantage of relatively easier computation.

3. Variations

Though the preferred embodiments of the present invention have been discussed above, the present invention is not limited to the above-discussed preferred embodiments but allows various variations.

Though the memory 4 and the memory controller 5 constitute the memory card 3 and are detachable from the computer 2 in the preferred embodiments, for example, the memory 4 and the memory controller 5 may be incorporated in the computer 2. In other words, the computer system 1 may be formed as an integral-type structure.

Further, only the memory 4 may be detachable. More precisely, a device controller specifically designed to serve as a memory controller 5 is provided in the computer 2 and only the memory 4 is inserted into an internal memory slot. Alternatively, the CPU 21 and the memory device 22 may have a function as the memory controller 5.

Furthermore, the reference information 55 may exist in the reserve storage region 41 of the memory 4. In other words, only if the required access time is satisfied in view of system design, the reference information 55 may not be transmitted to the controller memory 52 in advance.

While the invention has been shown and described in detail, the foregoing description is in all aspects illustrative and not restrictive. It is therefore understood that numerous modifications and variations can be devised without departing from the scope of the invention.

What is claimed is:

1. A memory system, comprising:
   a plurality of first blocks provided for storing user information, to which first physical addresses which are not duplicated are assigned, respectively;
   a plurality of second blocks provided for storing first physical addresses of defective blocks among said plurality of first blocks; and
   an operation device for obtaining a first physical address corresponding to a logical address on the basis of said logical address and information stored in said plurality of second blocks,
   wherein second physical addresses which are not duplicated are assigned to said plurality of second blocks, respectively,
   said operation device retrieves a target block out of said plurality of second blocks by using said logical address, obtains a number of normal first blocks positioned before the first physical address of a defective block which is read out from said target block on the basis of the first physical address of the defective block which is read out from said target block and the second physical address of said target block and obtains the first physical address corresponding to said logical address on the basis of said logical address and said number, and
   said operation device determines whether a candidate block out of said plurality of second blocks is the target block based on subtracting a value of the second physical address assigned to the candidate block from a value of the first physical address stored in the candidate block, and the candidate block is determined to be the target block when the candidate block has a lowest value of a second physical address among the plurality of second blocks for which a number obtained from the subtraction is larger than the logical address.

2. The memory system according to claim 1, wherein the first physical addresses of a plurality of defective blocks which are stored in said plurality of second blocks are stored into said plurality of second blocks in the order of said second physical addresses in accordance with the order of said first physical addresses.

3. The memory system according to claim 2, further comprising:
   a plurality of reserve blocks for storing the first physical addresses of the defective blocks among said plurality of first blocks; and
   a transmission part for transmitting information stored in said plurality of reserve blocks to said plurality of second blocks.

4. A computer system, comprising:
   a computer for generating a logical address as needed;
   a memory having a plurality of first blocks provided for storing user information, to which first physical addresses which are not duplicated are assigned, respectively;
   a controller memory having a plurality of second blocks provided for storing the first physical addresses of defective blocks among said plurality of first blocks, to which second physical addresses which are not duplicated are assigned, respectively; and
   an operation device for retrieving a target block out of said plurality of second blocks by using a logical address received from said computer, obtaining the number of normal first blocks positioned forward of the first physical address of a defective block which is read out from said target block on the basis of the first physical address of the defective block which is read out from said target block and the second physical address of said target block and obtaining the first physical address corresponding to said logical address on the basis of said logical address and said number,
   wherein said operation device determines whether a candidate block out of said plurality of second blocks is the target block based on subtracting a value of the second physical address assigned to the candidate block from a value of the first physical address stored in the candidate block, and the candidate block is determined to be the target block when the candidate block has a lowest value of a second physical address among the plurality of second blocks for which a number obtained from the subtraction is larger than the logical address.

5. A memory to which access is made with a physical address by an operation device which obtains the physical address from a logical address, comprising:
   a plurality of blocks each consisting of memory elements, to which physical addresses which are not duplicated are assigned,
   wherein said plurality of blocks comprises
   a plurality of first blocks provided for storing user information; and
   a plurality of second blocks provided for storing physical addresses of defective blocks among said plurality of first blocks, respectively, and
   the physical addresses of defective blocks in said plurality of second blocks are stored into said plurality of second blocks in the order of second physical addresses assigned to said plurality of second blocks in accordance with the order of said physical addresses,
   wherein said operation device retrieves a target block out of said plurality of second blocks by using said logical address, obtains a number of normal first blocks positioned before the first physical address of a defective block which is read out from said target block on the basis of the first physical address of the defective block which is read out from said target block and the second physical address of said target block and obtains the first physical address corresponding to said logical address on the basis of said logical address and said number, and
   said operation device determines whether a candidate block out of said plurality of second blocks is the target block based on subtracting a value of the second physical address assigned to the candidate block from a value of the first physical address stored in the candidate block, and the candidate block is determined to be the target block when the candidate block has a lowest value of a second physical address among the plurality of second blocks for which a number obtained from the subtraction is larger than the logical address.

6. A memory control method of controlling a memory which stores user information therein, comprising the steps of:
   a) storing addresses of defective blocks among a plurality of first blocks provided in said memory for storing user information therein into a plurality of second blocks, respectively; and b) obtaining an address of one of said first blocks corresponding to a logical address on the basis of said logical address and the information stored in said plurality of second blocks, wherein a target block is retrieved out of said plurality of second blocks by using said logical address, the number of normal first blocks positioned forward of an address of defective block which is read out from said target block is obtained on the basis of the address of defective block which is read out from said target block and the address of said target block and an address of said first block corresponding to said logical address on the basis of said logical address and said number in said step b), and said step b) includes determining whether a candidate block out of said plurality of second blocks is the target block based on subtracting a value of the second physical address assigned to the candidate block from a value of the first physical address stored in the candidate block, and the candidate block is determined to be the target block when the candidate block has a lowest value of a second physical address among the plurality of second blocks for which a number obtained from the subtraction is larger than the logical address.

7. The memory control method according to claim 6, wherein said memory has said plurality of first blocks and a plurality of reserve blocks for storing addresses of defective blocks among said plurality of first blocks, and the addresses of defective blocks are transmitted from said reserve blocks to said plurality of second blocks in said step a).

8. The memory system according to claim 1, wherein an initial candidate block is determined to be a center position of the plurality of second blocks, and when the number obtained from the subtraction is larger than the logical address, the second blocks having second physical addresses larger than the second physical address of the initial candidate block are excluded from being the target block, and the target block is determined from the remaining second blocks, and when the number obtained from the subtraction is not larger than the logical address, the second blocks having second physical addresses smaller than the second physical address of the initial candidate block are excluded from being the target block, and the target block is determined from the remaining second blocks.

\* \* \* \* \*